(12) United States Patent
Okuno et al.

(10) Patent No.: US 6,221,700 B1
(45) Date of Patent: Apr. 24, 2001

(54) METHOD OF MANUFACTURING SILICON CARBIDE SEMICONDUCTOR DEVICE WITH HIGH ACTIVATION RATE OF IMPURITIES

(75) Inventors: Eiichi Okuno, Motosu-gun; Jun Kojima, Obu, both of (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/362,088

(22) Filed: Jul. 28, 1999

(30) Foreign Application Priority Data

Jul. 31, 1998 (JP) .................................... 10-217727

(51) Int. Cl.[7] .................................................. H01L 21/00
(52) U.S. Cl. ........................ 438/151; 438/483; 438/518
(58) Field of Search ................... 438/482, 483, 438/150, 151, 514, 518, 519

(56) References Cited

U.S. PATENT DOCUMENTS

| | | |
|---|---|---|
| 5,338,945 * | 8/1994 | Baliga et al. .......................... 257/77 |
| 5,506,421 | 4/1996 | Palmour . |
| 5,744,826 | 4/1998 | Takeuchi et al. . |
| 5,773,849 | 6/1998 | Harris et al. . |

OTHER PUBLICATIONS

Seshadri et al., "Comparison of the annealing behavior of high–dose nitrogen–aluminum–, and boron–implanted 4H–SiC", American Institute of Applied Physics Letters, vol. 72, No. 16, Apr. 20, 1998, pp. 2026–2028.

* cited by examiner

Primary Examiner—Olik Chaudhuri
Assistant Examiner—Ginette Peralta
(74) Attorney, Agent, or Firm—Pillsbury Winthrop LLP

(57) ABSTRACT

A surface portion of a p type base region is made amorphous as an amorphous layer by implanting nitrogen ions which serve as impurities and ions which do not serve as impurities. After that, the amorphous layer is crystallized to have a specific crystal structure through solid-phase growth while disposing the impurities at lattice positions of the crystal structure. As a result, a surface channel layer is formed with a high activation rate of the impurities.

9 Claims, 6 Drawing Sheets

METHOD OF MANUFACTURING SILICON CARBIDE SEMICONDUCTOR DEVICE WITH HIGH ACTIVATION RATE OF IMPURITIES

CROSS REFERENCE TO RELATED APPLICATION

This application is based upon and claims the benefit of Japanese Patent Application No. 10-217727, filed on Jul. 31, 1998, the contents of which are incorporated herein by reference.

BACKGROUND OF THE INVENTION

1. Field of the Invention

This invention relates to a method of manufacturing a silicon carbide semiconductor device, capable of improving an activation rate of ions implanted into a silicon carbide semiconductor layer of the semiconductor device.

2. Description of the Related Art

Silicon carbide has been noted as a material for a high withstand voltage device usable at a high temperature. A process of manufacturing a silicon carbide device conventionally utilizes an ion-implantation technique capable of forming a high concentration region with high flexibility in manufacture. The ion-implantation technique includes high temperature ion-implantation for controlling crystal defects and high temperature heat treatment for activating impurities to realize a high activation rate of the impurities.

However, the activation rate is easily lowered due to reasons such that substitution of ion-implantation atoms is insufficient, implantation conditions (for instance, temperature) and heat treatment conditions (for instance, temperature and ambience) are not optimized, and the like.

SUMMARY OF THE INVENTION

The present invention has been made in view of the above problem. An object of the present invention is to improve an activation rate of impurities implanted into a silicon carbide semiconductor layer.

Briefly, according to a method of the present invention, an amorphous layer doped with n type or p type impurities is formed in contact with a silicon carbide semiconductor layer, and the amorphous layer is crystallized through a solid-phase growth to form an impurity layer having a specific crystal structure while disposing the impurities at lattice positions of the crystal structure. As a result, the impurities are securely substituted to the lattice positions of the crystal structure, resulting in a high activation rate of the impurities. The crystal structure of the impurity layer is preferably chosen so that a width of a forbidden band (bandgap) of the impurity layer becomes narrower than that of the semiconductor layer. Accordingly, when the impurity layer serves as a contact region, a contact resistance becomes small.

For instance, the invention can be applied to form a surface channel layer in a semiconductor device. Specifically, after an impurity implantation layer is formed in a surface portion of a base region by doping impurities thereinto, the impurity implantation layer is made amorphous by implanting ions, a kind of which is different from that of the impurities. Then, the amorphous layer is crystallized to have a specific crystal structure while disposing the impurities at lattice positions of the crystal structure, so that the surface channel layer is formed with a high activation rate of the impurities.

The invention can be applied to form a base region as well. Specifically, after an impurity implantation layer is formed in a specific surface portion of a semiconductor layer by doping impurities thereinto, the impurity implantation layer is made amorphous by doping ions, a kind of which is different from that of the impurities. Then, the amorphous impurity implantation layer is crystallized at a solid-phase to have a specific crystal structure while disposing the impurities at lattice positions of the crystal structure. As a result, the base region is formed with a high activation rate of the impurities.

BRIEF DESCRIPTION OF THE DRAWINGS

Other objects and features of the present invention will become more readily apparent from a better understanding of the preferred embodiments described below with reference to the following drawings.

DETAILED DESCRIPTION OF THE PREFERRED EMBODIMENT

Herebelow, a preferred embodiment of the present invention will be explained referring to drawings. A normally off type n channel planar MOSFET (vertical type power MOSFET) in the present embodiment is suitable for an inverter, a rectifier for an automotive alternator, and the like.

Figure 1:
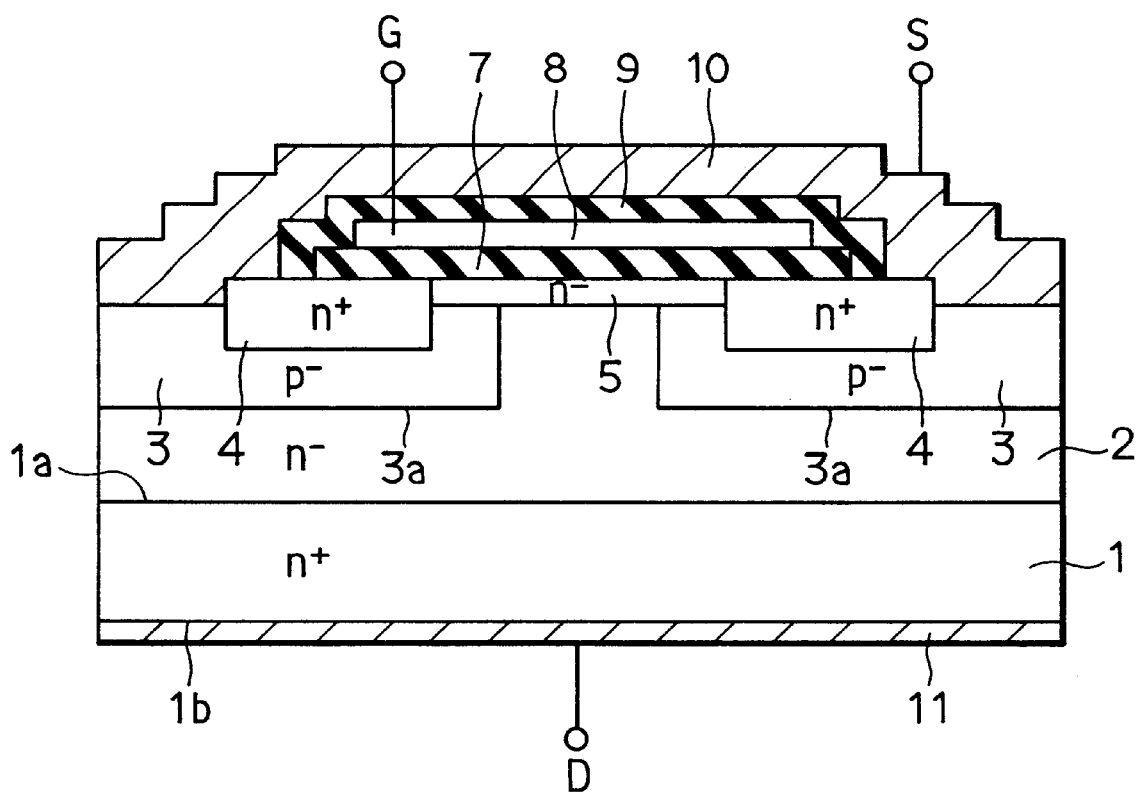
FIG. 1 is a cross-sectional view showing a planer MOSFET in a first preferred embodiment of the present invention.

Referring to FIG. 1, the vertical type power MOSFET includes an $n^+$ type semiconductor substrate 1 made of silicon carbide and having an upper main surface 1a and a lower back surface 1b. An $n^-$ type epitaxial layer ($n^-$ type epi-layer) 2 made of silicon carbide is formed on the main surface 1a of the substrate 1 with a dopant concentration lower than that of the substrate 1. A $p^-$ type base region 3 is provided in a specific surface region of the $n^-$ type epi-layer 2 at a specific depth. The $p^-$ type base region 3 is formed using boron (B) ions as dopant with a dopant concentration approximately equal to or larger than $1\times10^{17}$ cm$^{-3}$.

An $n^+$ type source region 4 is formed in a specific surface region of the $p^-$ type base region 3 at a depth shallower than that of the base region 3. An $n^-$ type SiC layer 5 is further provided in the surface region of the $p^-$ base region 3 to connect the $n^+$ type source region 4 and the $n^-$ type epi-layer 2 therethrough. The $n^-$ type SiC layer 5 is formed through epitaxial growth to have 4H (hexagonal system), 6H (hexagonal system), or 3C (cubic system) type crystal structures. The $n^-$ type SiC layer 5 functions as a channel formation layer when the device is operated, and therefore, it is herebelow referred as a surface channel layer. The surface channel layer 5 is formed using nitrogen (N) ions as dopant to have a low dopant concentration of, for instance, in a range of $1\times10^{15}$ cm$^{-3}$ to $1\times10^{17}$ cm$^{-3}$, which is lower than those of the $n^-$ type epi-layer 2 and the $p^-$ type base region 3, thereby providing low ON resistance.

A gate oxide film 7 is formed on the surface channel layer 5 and on the n+ type source region 4 by thermal oxidation, and a gate electrode 8 is formed on the gate oxide film 7. The gate electrode 8 is covered with an insulation film 9 composed of a low temperature oxide (LTO) film. A source electrode 10 is formed on the insulation film 9 to contact the n+ source region 4 and the p− base region 3. A drain electrode layer 11 is formed on the back surface 1b of the n+ type semiconductor substrate 1.

Figure 2A:
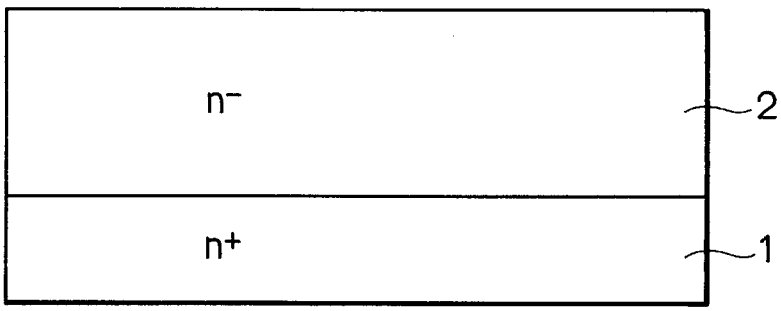
FIGS. 2A–2C, 3A–3C, 4A–4C, and 5 are cross-sectional views showing a process of manufacturing the planer MOSFET shown in FIG. 1 in a stepwise manner.

Next, a manufacturing process of the MOSFET shown in FIG. 1 will be explained referring to FIGS. 2 to 4.

First, an n type 4H, 6H, or 3C-SiC substrate, i.e., the n+ type semiconductor substrate 1 is prepared. The n+ type semiconductor substrate 1 is 400 μm in thickness, and has a (0001) Si plane or (11$\overline{2}$0) a plane on the main surface 1a thereof. Then, at a step shown in FIG. 2A, the n− type epi-layer 2 is epitaxially grown on the main surface 1a of the substrate 1 to have a thickness of 5 μm. In the present embodiment, the n− type epi-layer 2 has the same crystal structure as that of the underlying substrate 1, and is as an n type 4H, 6H, or 3C-SiC layer.

Figure 2B:
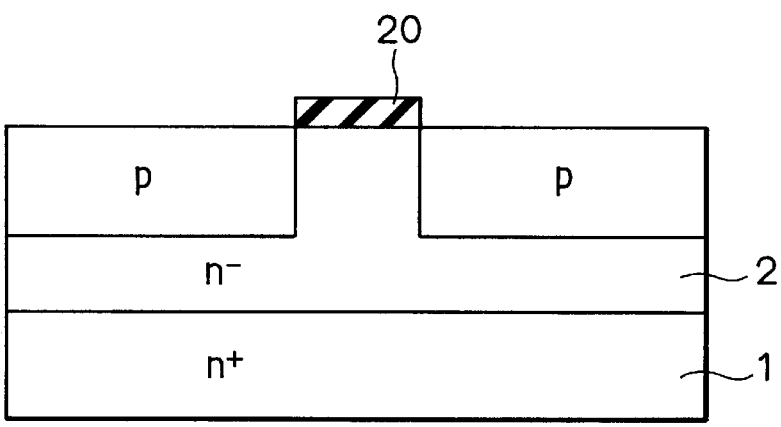

At a step shown in FIG. 2B, an LTO film 20 is disposed on a specific region of the n− type epi-layer 2, and ion-implantation of B ions is carried out using this film as a mask. Ion-implantation conditions are 700° C. in temperature, and 1×10$^{16}$ cm$^{-2}$ in dose. Accordingly, a box profile is defined by B ions at a specific depth from the surface of the n− type epi-layer 2. After that, activation annealing is carried out at 1600° C. for 30 min. so that B ions are activated to form the p type base region 3.

Figure 2C:
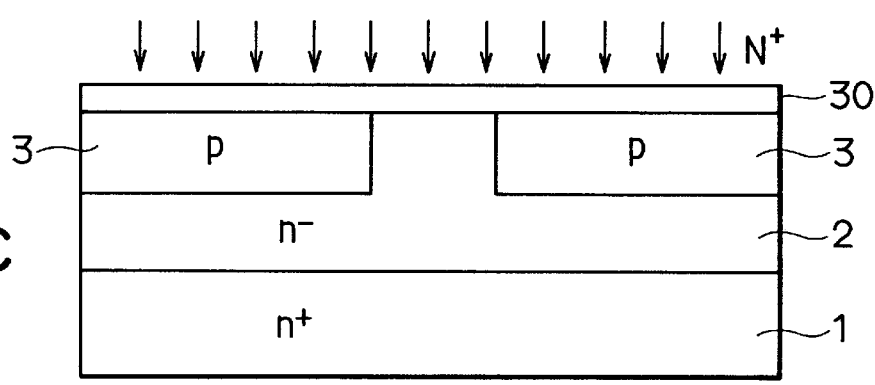

Then, at a step shown in FIG. 2C, nitrogen ions (N+) serving as n type impurities (dopant) are implanted into the n− type epi-layer 2 in which the p type base region 3 is formed. Accordingly, a nitrogen ion-implantation layer 30 is formed in the surface region of the p type base region 3 and the n− type epi-layer 2 to have a thickness equal to or less than 0.3 μm and an impurity (dopant) concentration equal to or less than 1×10$^{16}$ cm$^{-3}$.

Figure 3A:
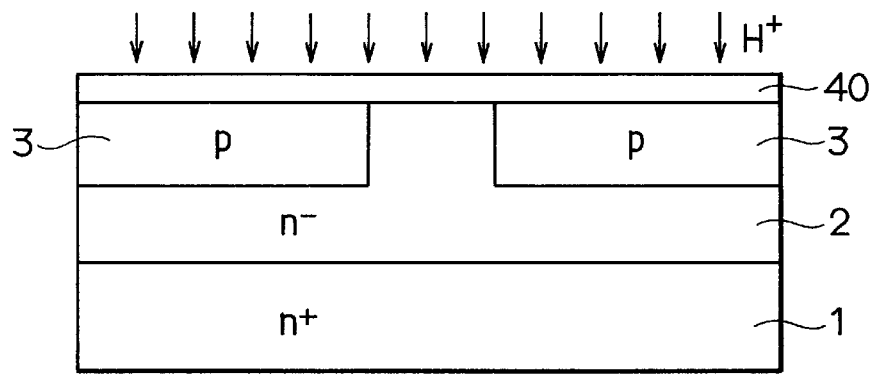
Figure 4A:
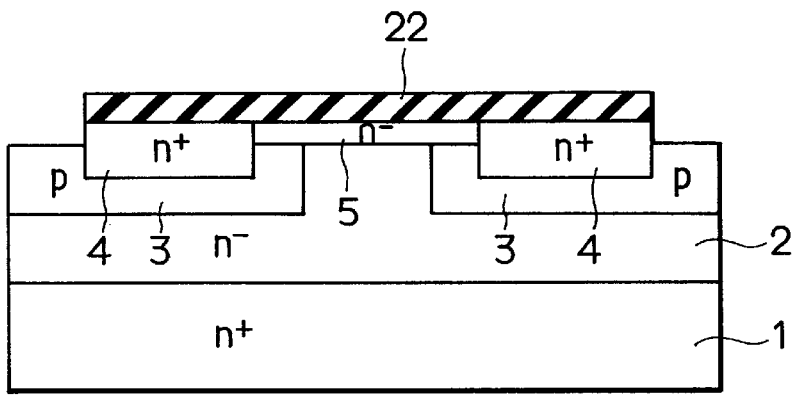

Next, at a step shown in FIG. 3A, ions which do not serve as n type or p type impurities, such as ions of hydrogen, oxygen, argon, or a mixture of silicon and carbon having the same content, are implanted into the nitrogen ion-implantation layer 30 to make the ion-implantation layer 30 amorphous, thereby forming an amorphous layer 40. The amorphous state of the layer 40 is controlled so that a peak intensity ratio of Raman spectra before and after the ion-implantation is decreased to around 1/10.

Figure 3B:
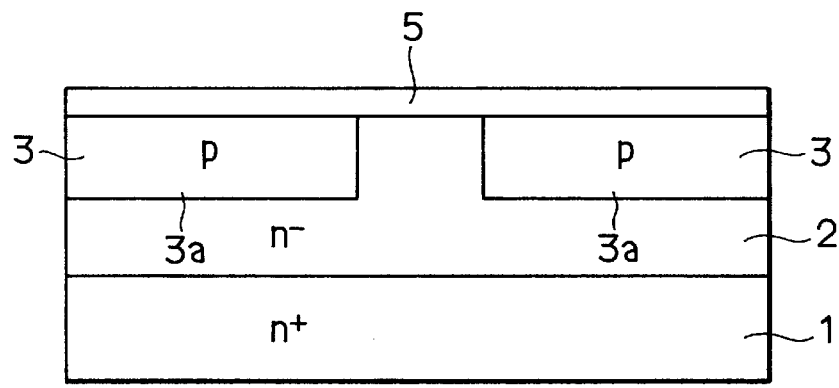
Figure 6A:
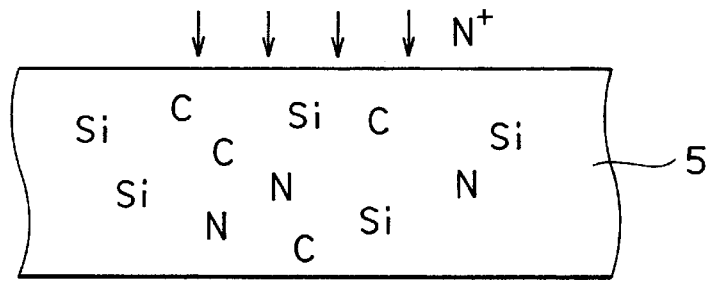
FIGS. 6A and 6B are schematic views for explaining states where an amorphous layer is crystallized in a solid phase.
Figure 6B:
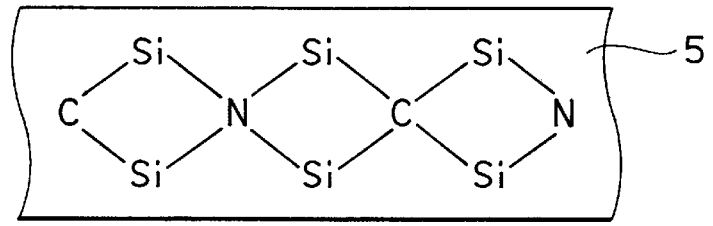

At a step shown in FIG. 3B, the amorphous layer 40 is crystallized through solid-phase growth to be 3C-SiC by a low temperature heat treatment performed at a temperature equal to or lower than 1500° C. FIGS. 6A and 6B show states before and after the solid-phase growth. The solid-phase growth is an epitaxial growth using a solid-phase growth source, and progresses while disposing the impurities, which have been doped into irregular positions (see FIG. 6A), at lattice positions of the crystal structure. Accordingly, the doped impurities are securely substituted into the lattice positions (see FIG. 6B). Consequently, the doped impurities are activated with a high activation rate. Incidentally, nitrogen impurities are arranged at a carbon site when they are taken into the lattice positions.

That is, in the present embodiment, the nitride implantation layer 30 is made amorphous by the implantation of the ions which do not serve not only as n type but also as p type impurities, thereby forming the amorphous layer 40. After that, the impurities in the amorphous layer 40 are activated with the high activation rate through the solid-phase growth. Further, a high temperature heat treatment is carried out at a temperature equal to or higher than 1800° C. so that 3C-SiC grown in the amorphous layer 40 is transformed into 4H or 6H-SiC in the solid phase. As a result, the surface channel layer 5 made of 4H or 6H-SiC having a mobility larger than that of 3C-SiC is formed.

The reason why the amorphous layer 40 is transformed into 4H or 6H-SiC from 3C-SiC is because 3C-SiC is stable at a low temperature. Therefore, stable 4H or 6H SiC can be easily formed through 3C-SiC as compared to a case where it is formed directly from the amorphous layer 40 by the high temperature heat treatment. However, it may be possible to stably form 4H or 6H-SiC directly from the amorphous layer 40 by optimizing heat treatment conditions.

At this step, the thickness of the surface channel layer 5 is controlled to be smaller than the sum of an extension amount of a depletion layer extending from the p type base region 3 into the surface channel layer 5 and an extension amount of a depletion layer extending from the gate oxide film 7 into the surface channel layer 5 when no voltage is applied to the gate electrode 8. Accordingly, the power MOSFET is set to be the normally off type. Specifically, the extension amount of the depletion layer extending from the p type base region 3 into the surface channel layer 5 is determined by a built-in potential of a PN junction between the surface channel layer 5 and the p type base region 3. The extension amount of the depletion layer extending from the gate oxide film 7 into the surface channel layer 5 is determined by the charge of the gate oxide film 7 and a difference in work function between the gate electrode (metal) 8 and the surface channel layer (semiconductor) 5. Therefore, the thickness of the surface channel layer 5 is determined based on these parameters.

In the normally off type vertical power MOSFET, because no current flows when voltage cannot be applied to the gate electrode due to some failures, the stability is higher than that of a normally on type. Further, as shown in FIG. 1, the p type base region 3 contacts the source electrode 10 to be grounded. Accordingly, the surface channel layer 5 can be brought to be a pinch-off state by controlling the built-in potential of the PN junction between the surface channel layer 5 and the p type base region 3. As opposed to this, when the p type base region 3 is in a floating state without being grounded, the depletion layer cannot be extended from the p type base region 3 by controlling the built-in potential. In view of this point, the structure in the present embodiment is effective to make the surface channel layer 5 pinch-off. The built-in potential can be increased by increasing the impurity concentration in the p type base region 3.

Further, in the present invention, because the normally off type vertical power MOSFET is formed from SiC, it can be manufactured with high accuracy. When the MOSFET is formed from Silicon, it is difficult to control thermally diffused amounts of impurities when the p type base region 3, the surface channel layer 5, and the like are formed. This makes difficult to form the normally off type MOSFET having the same structure as that in the present embodiment from silicon.

In addition, the thickness of the surface channel layer 5 must comply with the conditions for forming the normally off type vertical power MOSFET as described above. However, when silicon is utilized, the built-in potential becomes small. Because of this, the thickness of the surface channel layer 5 must be thinned, or the impurity concentration of the surface channel layer 5 must be decreased. This makes very difficult to manufacture the MOSFET in cooperation with the difficulty of controlling the impurity ion diffused amounts. It should be noted that the built-in potential when SiC is utilized is approximately three times larger than that when silicon is utilized. Thus, the normally off type and accumulation type MOSFET can be easily manufactured from SiC.

Figure 3C:
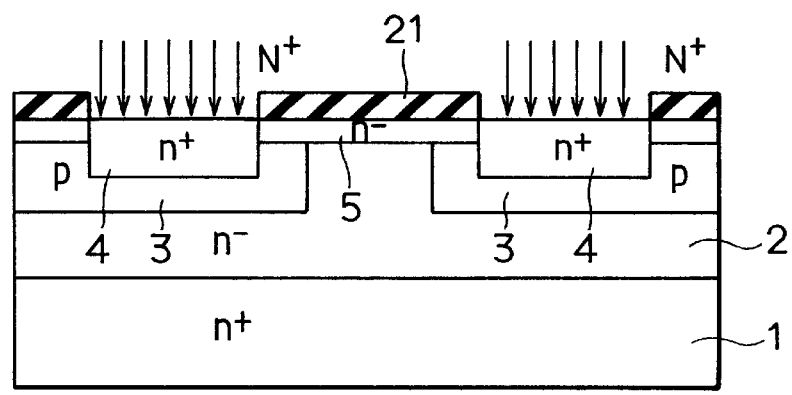

Next, at a step shown in FIG. 3C, an LTO film 21 is disposed on a specific region of the surface channel layer 5, and n type impurity ions such as nitrogen (N) ions are implanted to form the $n^+$ type source region 4 using the LTO film 21 as a mask. The ion-implantation conditions at this step are 700° C. in temperature and $1 \times 10^{15}$ cm$^{-2}$ in dose. After removing the LTO film 21, at a step shown in FIG. 4A, an LTO film 22 is disposed on a specific region of the surface channel layer 5 by a photo-resist method. Then, the surface channel layer 5 extending on the $p^-$ type base region 3 is partially removed by RIE using the LTO film 22 as a mask.

Figure 4B:
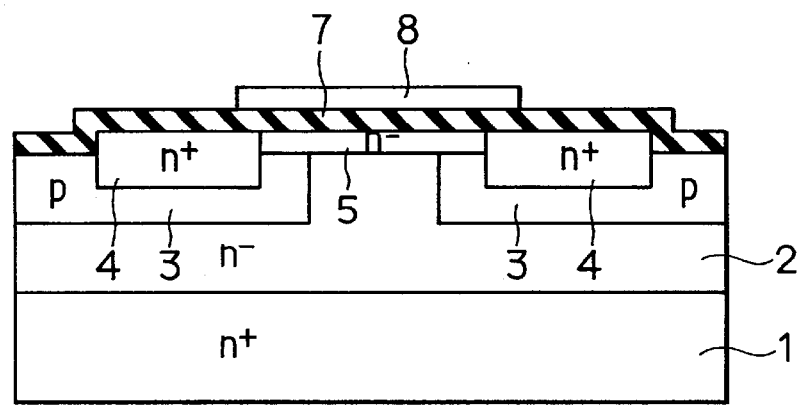
Figure 4C:
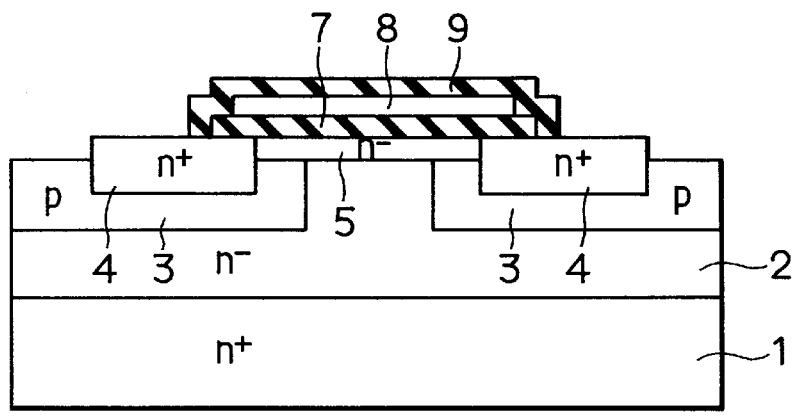
Figure 5:
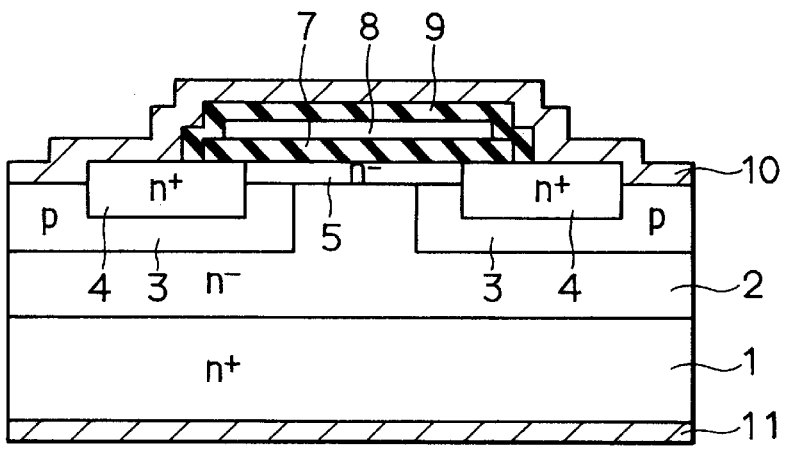

After removing the LTO film 22, at a step shown in FIG. 4B, the gate oxide film 7 is formed on the substrate by wet oxidation (for instance, a pyrogenic method performed in $H_2+O_2$) at 1080° C. After that, the gate electrode 8 made of polysilicon is deposited on the gate oxide film 7 by LPCVD at 600° C. Successively, after removing an unnecessary portion of the gate oxide film 7, at a step shown in FIG. 4C, the insulation film 9 made of LTO is deposited at 425° C. to cover the gate oxide film 7 and the gate electrode 8. After the deposition, annealing is carried out at 1000° C. Then, at a step shown in FIG. 5A, the source electrode 10 and the drain electrode 11 are disposed by metal sputtering at a room temperature. After that, annealing is further carried out at 1000° C. Thus, the vertical power MOSFET shown in FIG. 1 is completed.

Next, an operation of the MOSFET manufactured as described above will be explained. The MOSFET in the present embodiment is the normally off type and works at an accumulation mode. When no voltage is applied to the gate electrode 8, carriers in the surface channel layer 5 are entirely depleted by a difference in electrostatic potential between the p type base region 3 and the surface channel layer 5, and the potential produced by a difference in work function between the surface channel layer 5 and the gate electrode 8. The application of the voltage to the gate electrode 8 varies the potential difference produced by the sum of the difference in work function between the surface channel layer 5 and the gate electrode 8 and the externally applied voltage. Accordingly, the channel state is controlled.

That is, when the work functions of the gate electrode 8, the p type base region 3, and the surface channel layer 5 are represented as first, second, and third work functions, respectively, the first to third work functions, and the impurity concentration and the thickness of the surface channel 5 are set so that the n type carriers in the surface channel layer 5 can be depleted by utilizing the differences among the first to third work functions.

In the OFF state, the depleted region is formed in the surface channel layer 5 by an electric field produced between the p type base region 3 and the gate electrode 8. In this state, a positive bias is applied to the gate electrode 8. Accordingly, a channel region is provided at the interface between the gate insulation ($SiO_2$) film 7 and the surface channel layer 5 to extend from the $n^+$ type source region 4 toward the $n^-$ type epi-layer 2, thereby switching to the ON state. In the ON state, electrons flow from the $n^+$ type source region 4 to the $n^-$ type epi-layer 2 through the channel region, and then flow perpendicularly to the $n^+$ type semiconductor substrate 1 ($n^+$ type drain electrode) from the $n^-$ type epi-layer 2.

Thus, the accumulation type channel is induced in the surface channel layer 5 by the positive voltage applied to the gate electrode 8, and as a result, carriers flow between the source electrode 10 and the drain electrode 11. Incidentally, although the surface channel layer 5 is made of 4H or 6H-SiC in the present embodiment, the crystal structure of the surface channel layer 5 may be different from that of the semiconductor substrate 1, or be identical with that. Any one of 3C, 4H, 6H, and 15R type crystal structures is applicable to the surface channel layer 5.

Also, the amorphous layer 40 for forming the surface channel layer 5 is formed by ion-implantation; however, it may be formed by epitaxial growth while being doped with n type impurities in an epitaxial growth apparatus (for instance, a CVD apparatus or an MBE apparatus). In this case, undesirable ion kinds can be prevented from being implanted into the amorphous layer by controlling the temperature within the epitaxial growth apparatus relatively low.

(Second Embodiment)

Figure 7:
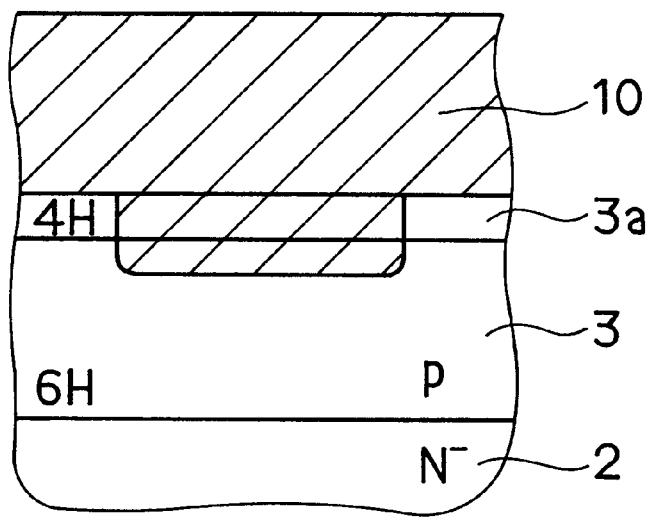
FIG. 7 is an explanatory view showing a case where the present invention is applied to a p type base region in a second preferred embodiment.

In a second preferred embodiment, the present invention is adopted to reduce contact resistance of the vertical power MOSFET. FIG. 7 shows an enlarged contact region between the p type base region 3 and the source electrode 10. In the second embodiment, only the contact region shown in FIG. 7 is modified from that shown in FIG. 1, and the other features are the same as those shown in FIG. 1.

As shown in FIG. 7, in the p type base region 3, a contact portion 3a contacting the source electrode 10 has a 4H-type crystal structure, and the other region has another crystal structure (6H). Specifically, the contact portion 3a is made of SiC having a bandgap larger than that of the other region in the p type base region 3.

Further, Al or the like forming the source electrode 10 is diffused into the other p type base region 3 passing through the contact portion 3a. This state is formed by diffusing the metal into the p type base region 3 through the contact portion 3a at an annealing treatment, and after that, the source electrode 10 is formed as a metallic wiring pattern. In the structure described above, because the p type base region 3 is composed of the 4H and 6H regions having bandgaps different from each other, a high concentration carrier layer is formed in a surface portion of the 6H region contacting a hetero junction interface formed between the 6H and 4H regions. The p type base region 3 is electrically connected to the source electrode 10 through the high concentration carrier layer, resulting in a decrease in contact resistance.

The MOSFET having the above-described structure is formed as follows. First, the surface region of the p type base region 3 made of 6H-SiC is made amorphous by ion-implantation. Then, the amorphous region is crystallized through solid phase growth to be the contact portion 3a having 4H-type crystal structure that has a bandgap larger than that of the other part of the p type base region 3. Thus, the present invention can be applied to the contact portion between the p type base region 3 and the source electrode 10.

The present invention is applied to the planar type MOSFET in the embodiments described above; however, it may be applied to other semiconductor devices such as a HEMT having a hetero structure.

Specifically, according to the present invention, a SiC region can have two regions having bandgaps different from each other by making a part of the SiC region amorphous by ion-implantation, and by crystallizing the amorphous region through solid-phase growth. Therefore, when the bandgap of the solid-phase transformation region is made large, carriers are supplied from the solid-phase transformation region to a substrate side. This makes it possible to form the same structure as a so-called GaAs/AlGaAs HEMT. In this structure, the region into which impurities are doped is different from the region in which carriers are transmitted. The carries are transmitted in the region in which no impurity is doped. Therefore, a scattering effect by ionized impurities can be minimized, thereby realizing a high mobility.

Figure 8:
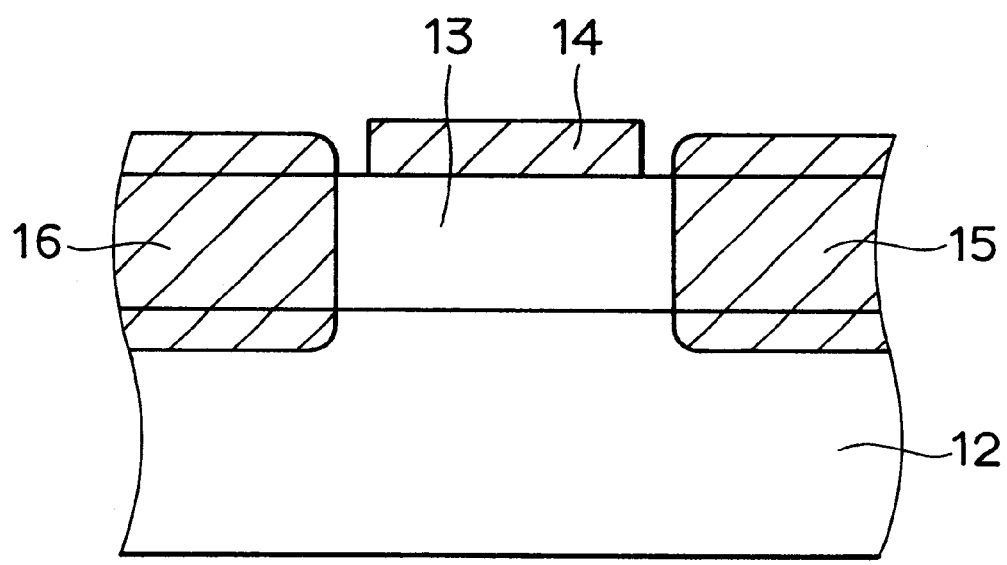
FIG. 8 is a schematic view showing a HEMT structure in another embodiment of the present invention.

FIG. 8 shows a HEMT structure. An n type 4H-SiC layer 13 is formed on a non-doped 6H-SiC layer 12, and a gate electrode 14 is formed on the n type 4H-SiC layer 13. The gate electrode 14 may be a Shottkey electrode made of Ti or the like, or be a so-called MIS structure electrode disposed on the n type 4H-SiC layer 13 through an insulation film such as an oxide film. Further, metallized electrodes 15, 16 are formed by a diffusion (metallizing) treatment to extend from the surface of the n type 4H-SiC layer 13 into the 6H-SiC layer 12. Accordingly, carriers are produced at the junction interface between the n type 4H-SiC layer 13 and the 6H-SiC layer 12, thereby providing a high mobility semiconductor element.

In the second embodiment described above, the contact portion 3a of the p type base region 3 is made of SiC having a large bandgap; however, the p type base region 3 may be formed through solid-phase growth to have a crystal structure which provides a potential barrier smaller than that of the n type epi-layer 2. Accordingly, the same effects as in the second embodiment can be provided by the same reason as described above. A crystal structure combination of the p type base region 3 and the n type epi-layer 2 can be selected from 6H and 4H, 3C and 6H, and 3C and 4H.

The contacting manners between the SiC region and the metal region described in the second embodiment and the HEMT structure shown in FIG. 8 are formed based on the following considerations. When impurities are implanted into SiC, the impurities have energy levels deeper than the energy band (valence band, conduction band) as compared to other semiconductor materials (Si, GaAs, and the like). Therefore, it is difficult for the impurities to produce carriers of holes and electrons even when the impurities are disposed at lattice positions through solid-phase transformation as in the embodiments described above.

Therefore, the hetero junction (modulation doping) of SiC composed of several regions having different crystal structures with different bandgaps from each other is provided to effectively use carriers produced by the impurities disposed at the lattice positions. For instance, in the case of the junction between 4H-SiC and 6H-SiC, because the bandgap of 4H-SiC is larger than that of 6H-SiC, the hetero junction is provided with an energy level which suddenly decreases from 4H-SiC to 6H-SiC. It is considered that carriers are discharged from the hetero junction interface not through the conduction and balance bands. Accordingly, the activation rate is securely improved.

In view of this point, the present invention can be considered as an invention capable of improving an activation rate of impurities by a hetero junction formed between SiC regions having different crystal structures from each other. That is, in the contact structure of the second embodiment and the HEMT structure described above, the activation rate of impurities is improved not only by utilizing solid-phase transformation but also by utilizing the hetero junction structure.

In the first embodiment described above, the present invention is applied to form the surface channel layer 5 with a high activation rate; however, it may be applied to form another region by bringing the region into an amorphous state and by causing it to undergo a solid-phase transformation. As a result, the region can have a high activation rate. In the first embodiment, the surface channel layer is made amorphous so that the Raman spectrum ratio becomes larger than a specific value by implanting ions such as hydrogen ions which serve as neither n type impurities nor p type impurities. However, when the dose of n type impurities or p type impurities is so large as to satisfy the condition described above, it is not necessary to implant the ions which serve as neither n type impurities nor p type impurities.

While the present invention has been shown and described with reference to the foregoing preferred embodiments, it will be apparent to those skilled in the art that changes in form and detail may be made therein without departing from the scope of the invention as defined in the appended claims.

What is claimed is:

1. A method of manufacturing a semiconductor apparatus having a silicon carbide semiconductor layer, comprising:

forming an amorphous layer in contact with the silicon carbide semiconductor layer, the amorphous layer being doped with n type or p type impurities; and crystallizing the amorphous layer through a solid-phase growth to be an impurity layer having a specific crystal structure while disposing the impurities at lattice positions of the crystal structure, wherein the amorphous layer is formed only by implanting the impurities thereinto.

2. A method of manufacturing a semiconductor apparatus having a silicon carbide semiconductor layer, comprising:

forming an amorphous layer in contact with the silicon carbide semiconductor layer, the amorphous layer being doped with n type or p type impurities, wherein forming the amorphous layer includes implanting the impurities into a specific region of the silicon carbide semiconductor layer and implanting ions, a kind of which is different from that of the impurities, into the specific region to make the specific region amorphous; and crystallizing the amorphous layer through a solid-phase growth to be an impurity layer having a specific crystal structure while disposing the impurities at lattice positions of the crystal structure, wherein the kind of ions is a mixture of silicon and carbon having contents approximately equal to each other.

3. A method of manufacturing a semiconductor apparatus having a silicon carbide semiconductor layer, comprising:

forming an amorphous layer in contact with the silicon carbide semiconductor layer, the amorphous layer being doped with n type or p type impurities; and crystallizing the amorphous layer through a solid-phase growth to be an impurity layer having a specific crystal structure while disposing the impurities at lattice positions of the crystal structure, wherein a width of a forbidden band of the impurity layer is narrower than that of the silicon carbide semiconductor layer.

4. The method of claim 3, wherein a combination of the crystal structure of the impurity layer and a crystal structure of the silicon carbide semiconductor layer is one selected from a group consisting of 6H and 4H, 3C and 6H, and 3C and 4H.

5. A method of manufacturing a semiconductor device, comprising:

forming a semiconductor layer on a main surface of a semiconductor substrate, the semiconductor layer and the semiconductor substrate being made of silicon carbide with a first conductive type, the semiconductor layer having a value of resistance larger than that of the semiconductor substrate;

forming a second conductive type base region in a surface portion of the semiconductor layer;

forming an impurity implantation layer in a surface portion of the base region by implanting first conducive type impurities into the surface portion;

implanting ions, a kind of which is different from that of the first conductive type impurities, into the impurity implantation layer to make the impurity implantation layer amorphous;

forming a first conductive type surface channel layer having a specific crystal structure by crystallizing the amorphous impurity implantation layer at a solid-phase while disposing the impurities at lattice positions of the crystal structure;

forming a first conductive type source region in a surface portion of the base region in contact with the surface channel layer, at a depth shallower than that of the base region;

forming a gate electrode on the surface channel layer with a gate insulation film interposed therebetween;

forming a source electrode in contact with the base region and the source region; and forming a drain electrode on a back surface of the semiconductor substrate.

6. The method of claim 5, wherein the kind of ions is one selected from a group consisting of hydrogen, oxygen, argon, and a mixture of silicon and carbon having contents approximately equal to each other.

7. A method of manufacturing a semiconductor device, comprising:

forming a semiconductor layer on a main surface of a semiconductor substrate, the semiconductor layer and the semiconductor substrate being made of silicon carbide with a first conductive type; the semiconductor layer having a value of resistance larger than that of the semiconductor substrate forming an impurity implantation layer in a surface portion of the semiconductor layer by implanting second conducive type impurities into the surface portion;

implanting ions, a kind of which is different from that of the second conductive type impurities, into the impurity implantation layer to make the impurity implantation layer amorphous, wherein the kind of ions is a mixture of silicon and carbon having contents approximately equal to each other;

forming a second conductive type base region having a specific crystal structure by crystallizing the amorphous impurity implantation layer at a solid-phase while disposing the impurities at lattice positions of the crystal structure;

forming a first conductive type surface channel layer on the base region;

forming a first conductive type source region in a surface portion of the base region in contact with the surface channel layer, at a depth shallower than that of the base region;

forming a gate electrode on the surface channel layer with a gate insulation film interposed therebetween;

forming a source electrode in contact with the base region and the source region; and forming a drain electrode on a back surface of the semiconductor substrate.

8. A method of manufacturing a semiconductor apparatus having a silicon carbide semiconductor layer, comprising:

forming an amorphous layer in contact with the silicon carbide semiconductor layer, the amorphous layer being doped with n type or p type impurities; and crystallizing the amorphous layer through a solid-phase growth to be an impurity layer having a specific crystal structure while disposing the impurities at lattice positions of the crystal structure, wherein a width of a forbidden band of the base region is narrower than that of the semiconductor layer.

9. A method of manufacturing a semiconductor apparatus having a silicon carbide semiconductor layer, comprising:

forming an amorphous layer in contact with the silicon carbide semiconductor layer, the amorphous layer being doped with n type or p type impurities, wherein forming the amorphous layer includes implanting the impurities into a specific region of the silicon carbide semiconductor layer and implanting ions, a kind of which is different from that of the impurities, into the specific region to make the specific region amorphous; and crystallizing the amorphous layer through a solid-phase growth to be an impurity layer having a specific crystal structure while disposing the impurities at lattice positions of the crystal structure, wherein the kind of ions is hydrogen.

* * * * *